(12) United States Patent
Lasser

(10) Patent No.: US 7,823,043 B2
(45) Date of Patent: Oct. 26, 2010

(54) CORRUPTION-RESISTANT DATA PORTING WITH MULTIPLE ERROR CORRECTION SCHEMES

(75) Inventor: Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 209 days.

(21) Appl. No.: 11/505,798

(22) Filed: Aug. 18, 2006

(65) Prior Publication Data
US 2007/0283214 A1 Dec. 6, 2007

Related U.S. Application Data

(60) Provisional application No. 60/746,891, filed on May 10, 2006.

(51) Int. Cl.
*H03M 13/00* (2006.01)
(52) U.S. Cl. .................. 714/755; 714/752; 714/758
(58) Field of Classification Search .............. 714/755, 714/773, 758
See application file for complete search history.

(56) References Cited

U.S. PATENT DOCUMENTS

| | | | |
|---|---|---|---|
| 4,712,215 A | 12/1987 | Joshi et al. | |
| 5,404,485 A | 4/1995 | Ban | |
| 6,041,001 A * | 3/2000 | Estakhri | 365/200 |
| 7,346,829 B2 * | 3/2008 | Riho et al. | 714/758 |
| 2002/0083391 A1 | 6/2002 | Huggett et al. | |
| 2003/0061558 A1 * | 3/2003 | Fackenthal et al. | 714/755 |
| 2004/0015771 A1 | 1/2004 | Lasser et al. | |
| 2004/0181734 A1 * | 9/2004 | Saliba | 714/758 |
| 2007/0157064 A1 * | 7/2007 | Falik et al. | 714/755 |
| 2008/0034272 A1 | 2/2008 | Wu et al. | |

OTHER PUBLICATIONS

International Search Report, International Application No. PCT/IL2006/01249, dated Oct. 15, 2008, 7 pages.

* cited by examiner

*Primary Examiner*—Sam Rizk
(74) *Attorney, Agent, or Firm*—Toler Law Group

(57) ABSTRACT

To export (e.g., store or transmit) input data, only the input data are encoded separately according to first and second encoding schemes to provide first and second encoded data. The first encoded data and the second encoded data are exported. Upon importing (e.g., retrieving or receiving) representations of the exported data, a first decoding scheme is applied to the representation of the first encoded data to recover the input data. If that application fails, then a second decoding scheme is applied to the representation of the second encoded data to recover the input data.

33 Claims, 3 Drawing Sheets

CORRUPTION-RESISTANT DATA PORTING WITH MULTIPLE ERROR CORRECTION SCHEMES

This patent application claims the benefit of U.S. Provisional Patent Application No. 60/746,891, filed May 10, 2006

FIELD AND BACKGROUND OF THE INVENTION

The present invention relates to the protection of data from corruption and, more particularly, to a method and related systems that use multiple error correction schemes to protect data from corruption.

Flash memory devices have been known for many years. NAND-type flash memories differ from other types of flash memories (e.g. NOR-type), among other characteristics, by the fact that a certain number of information bits, written to the memory, may be read from the memory in a "flipped" state (ie. different from the state that the original bits were written to the memory).

In order to overcome this phenomenon and to make NAND-type memories usable by real applications, it is a common technique to use Error Correction Codes (ECC) in conjunction with these memories. A general overview of using ECC in flash memories is presented below and includes the following steps:

(1) Before writing data to the memory, an ECC algorithm is applied to the data in order to compute additional (i.e. redundant) bits, which are later used for error detection and correction. These redundant bits are often called "parity bits" or "parity". A combination of the data input into an ECC module and the parity output by that module is called a codeword. Each different value of input data to an ECC module results in a different codeword.

(2) The entire codeword (i.e., the original data and the parity) is recorded to the flash memory. It should be noted, that the actual size of NAND-type flash memory is larger than the size of the original data, and the memory is designed to accommodate parity as well.

(3) When the data are retrieved from the memory, the entire codeword is read again, and an ECC algorithm is applied to the data and the parity in order to detect and correct possible "bit flips" (i.e., errors).

It should be noted that the implementation of ECC may be done by hardware, software, or a combination of hardware and software. Furthermore, ECC may be implemented within a memory device, within a memory device controller, within a host computer, or may be "distributed" among these components of a system.

The design of ECC algorithms is well known in the art. The algorithms in common use include Reed-Solomon, BCH, Hamming, and many others. Each ECC algorithm is composed of two parts—the part that receives the data bits and generates the parity bits (or equivalently, generates the codeword), and the part that receives the codeword and generates the corrected data bits. The first part is called the "encoder" and is used during writing, and the second part is called the "decoder" and is used during reading. Each of the two parts may be implemented in either hardware or software, and it is also possible to have one part implemented in hardware while the other part implemented in software.

Receiving the data bits and generating the corresponding codeword is termed "encoding" herein. Receiving the codeword and generating the corrected data bits is termed "decoding" herein.

It should be noted that there actually are two kinds of ECC. The kind of ECC described above, in which the identity of the data bits is preserved in the codeword, is called "systematic" ECC. In "nonsystematic" ECC, the data bits are converted to a codeword in which the identity of the original data bits is not preserved.

Selecting an algorithm, like BCH, as the ECC algorithm to be used in a flash memory system, does not uniquely define the selected solution. Any such ECC algorithm is actually not a single algorithm but a family of algorithms. The algorithms within the same family differ among themselves in the amount of data bits they are able to protect. An algorithm that needs to protect 100 data bits is not identical to an algorithm that needs to protect 10,000 data bits, even though the two algorithms are typically quite similar and operate on the same principles.

But even two algorithms of the same family that both protect the same number of data bits are not necessarily identical. The algorithms may differ in the level of reliability provided, or equivalently—in the number of bit errors in the data that the algorithms are able to correct. For example, one system may require the protection of chunks of 1,000 data bits against any combination of up to 3 bit errors (but not against the occurrence of 4 or more bit errors), while in another system a much higher reliability is desired and therefore it is required to protect chunks of 1,000 data bits against any combination of up to 10 bit errors. Typically, protecting against more errors requires the use of more parity bits (or longer codewords), making the ECC scheme less "efficient", where efficiency is measured by the ratio of the number of data bits in a codeword to the total number of bits in the codeword (including, in systematic ECC, both data bits and parity bits). This measure is typically called the "rate" of the ECC coding.

Different ECC algorithms and implementations also differ in other aspects—speed of the encoding process, speed of the decoding process, complexity of the encoding process, complexity of the decoding process, acceptable error rate in the input to the decoder (defined according to the quality of the storage cells), and more. The complexity of encoding and decoding is important not only because it affects the speed of the operation, but also because it affects the power consumption and silicon area of hardware implementations of the ECC scheme.

It is thus evident that the selection of an ECC solution for a memory system involves a complex trade-off between multiple considerations. Some non-limiting rules-of-thumb typical in the art of ECC designs are:

a. For a given memory reliability, the better the output reliability (or equivalently the higher the number of correctable errors) the lower the rate of the code (or equivalently, for systematic ECC, the more parity bits are required)

b. For a given memory reliability, the better the output reliability, the more complex is the decoder.

c. For a given level of output reliability, the higher the rate of the code, the more complex is the decoder.

d. For a given level of output reliability, the higher the rate of the code, the slower is the decoding.

When designing an ECC solution, one typically starts from the error rate at the decoder's input (dictated by the quality of the storage cells) and the desired output reliability (dictated by the application's requirements). Based on these numbers one typically selects a specific ECC family, calculates the required number of parity bits, and then estimates the speed and complexity of the encoder and decoder.

In some cases the most important consideration for the system's designer is the speed of the decoding, as this may put a limit on the speed of reading the data out from the memory. In such cases the designer may encounter a dilemma—the ECC scheme required for meeting the output reliability requirements may turn out to result in a quite complex decoder with slow operation, not satisfying the speed target of the system. But on the other hand, selecting an ECC scheme that is relatively simple, and that results in fast decoding, does not provide the required output reliability level.

There is thus a widely recognized need for, and it would be highly advantageous to have, an error correction solution that satisfies both requirements (i.e. both speed and reliability) at the same time, even when there is no ECC scheme known in the art that achieves this goal.

DEFINITIONS

The present invention is applicable to protecting data from corruption in at least two different circumstances. One circumstance is the storing of the data in a storage medium, followed by the retrieving of the data from the storage medium. The other circumstance is the transmitting of the data to a transmission medium, followed by the receiving of the data from the transmission medium. Therefore, the concepts of "storing" and "transmitting" of data are generalized herein to the concept of "exporting" data, and the concepts of "retrieving" and "receiving" data are generalized herein to the concept of "importing" data. Both "storing" data and "transmitting" data thus are special cases of "exporting" data, and "both "retrieving" data and "receiving" data are special cases of "importing" data. The process of "exporting" data and then optionally "importing" the data is termed herein "porting" data.

SUMMARY OF THE INVENTION

According to the present invention there is provided a method of porting input data, including the steps of: (a) encoding only the input data according to a first encoding scheme, thereby providing first encoded data; (b) encoding only the input data according to a second encoding scheme different from the first encoding scheme, thereby providing second encoded data; and (c) exporting the first encoded data and the second encoded data to a corrupting medium.

According to the present invention there is provided a system for porting input data, including: (a) an export device operative: (i) to encode only the input data according to a first encoding scheme, thereby providing first encoded data; (ii) to encode only the input data according to a second encoding scheme different from the first encoding scheme, thereby providing second encoded data; and (iii) to export the first encoded data and the second encoded data to a corrupting medium.

According to the present invention there is provided a computer-readable storage medium having computer-readable code embodied on the computer-readable storage medium, the computer-readable code for porting input data; the computer-readable code including: (a) program code for encoding only the input data according to a first encoding scheme, thereby providing first encoded data; (b) program code for encoding only the input data according to a second encoding scheme different from the first encoding scheme, thereby providing second encoded data; (c) program code for applying a first decoding scheme to a representation of the first encoded data to recover the input data; (d) program code for deciding whether the applying of the first decoding scheme succeeds, and (e) program code for applying a second decoding scheme to a representation of the second encoded data to recover the input data if the applying of the first decoding scheme fails.

According to the present invention there is provided a method of decoding a word that represents data, including the steps of: (a) applying a first decoding scheme to at least a first portion of the word to recover the data; and (b) if the applying of the first decoding scheme fails: applying a second decoding scheme to at least a second portion of the word to recover the data.

According to the present invention there is provided a receiver, for receiving a word that represents data, the receiver being operative: (a) to apply a first decoding scheme to at least a first portion of the word to recover the data; and (b) if the applying of the first decoding scheme fails: to apply a second decoding scheme to at least a second portion of the word to recover the data.

According to the present invention there is provided a controller, of a memory wherein is stored data represented as a word, the controller being operative: (a) to apply a first decoding scheme to at least a first portion of the word to recover the data; and (b) if the applying of the first decoding scheme fails: to apply a second decoding scheme to at least a second portion of the word to recover the data.

According to the present invention there is provided a memory device including: (a) a memory for storing data represented as a word; and (b) a controller operative: (i) to apply a first decoding scheme to at least a first portion of the word to recover the data, and (ii) if the applying of the first decoding scheme fails: to apply a second decoding scheme to at least a second portion of the word to recover the data.

According to the present invention there is provided a system for storing data, including: (a) a memory device, wherein the data are represented as a word; and (b) a processor operative: (i) to apply a first decoding scheme to at least a first portion of the word to recover the data, and (ii) if the applying of the first decoding scheme fails: to apply a second decoding scheme to at least a second portion of the word to recover the data.

According to the present invention there is provided a computer-readable storage medium having computer-readable code embodied on the computer-readable storage medium, the computer-readable code for decoding a word that represents data, the computer-readable code including: (a) program code for applying a first decoding scheme to at least a first portion of the word to recover the data; (b) program code for deciding whether the applying of the first decoding scheme succeeds; and (c) program code for applying a second decoding scheme to at least a second portion of the word to recover the data if the applying of the first decoding scheme fails.

According to the basic method of the present invention for porting input data, the input data are encoded separately according to two different encoding schemes. The encoding according to the first encoding scheme provides first encoded data. The encoding according to the second encoding scheme provides second encoded data. Note that the only input to the first encoding scheme is the input data and that the only input to the second encoding scheme also is the input data. This distinguishes the basic method of the present invention from a prior art method, discussed below, in which input data are encoded twice but in which the input to the second encoding includes more than just the input to the first encoding. Also note that the first encoded data and the second encoded data may overlap. For example, in the preferred embodiments discussed below, the encoding schemes are systematic, the first encoded data are the concatenation of the input data and the parity bits generated by the application of the first encoding scheme, and the second encoded data are the concatenation of the input data and the parity bits generated by the application of the second encoding scheme. Then the first encoded data and the second encoded data are exported to a corrupting medium. A "corrupting" medium is a medium that may introduce errors to data that are exported to the medium, so that the corresponding imported data may not be identical to the exported data.

Preferably, the encoding according to the first encoding scheme and the encoding according to the second encoding scheme are effected substantially simultaneously, rather than sequentially.

In one class of preferred embodiments of the present invention, the medium is a transmission medium, such as free space for electromagnetic transmissions generally, a coaxial cable for RF transmissions or an optical fiber for optical transmissions. The exporting includes transmitting the first encoded data and the second encoded data via the transmission medium.

In another class of preferred embodiments of the present invention, the medium is a storage medium, such as a RAM, a hard disk or a flash EEPROM. The exporting includes storing the first encoded data and the second encoded data in the storage medium.

Preferably, at least one of the encoding schemes is a systematic encoding scheme. Alternatively, at least one of the encoding schemes is a non-systematic encoding scheme.

Preferably, the method includes importing a representation of the first encoded data and importing a representation of the second encoded data. What is imported is termed herein a "representation" of the exported data because what is imported may be corrupted relative to what is exported. Then a first decoding scheme is applied to the representation of the first encoded data to recover the input data. If the application of the first decoding scheme fails then a second decoding scheme is applied to the representation of the second encoded data to recover the input data.

Most preferably, the second decoding scheme is different from the first decoding scheme. Also most preferably, the first decoding scheme corresponds to the first encoding scheme and the second decoding scheme corresponds to the second encoding scheme.

A basic system of the present invention for porting input data includes an export device that implements the basic method of the present invention as described above.

In one class of preferred embodiments of the present invention, the medium to which the system exports the first and second encoded data is a transmission medium. The export device includes a transmitter that transmits the first encoded data and the second encoded data via the transmission medium. Most preferably, the system also includes a receiver for receiving a representation of the first encoded data and for receiving a representation of the second encoded data. The receiver applies a first decoding scheme to the representation of the first encoded data to recover the input data. If the application of the first decoding scheme fails, then the receiver applies a second decoding scheme to the representation of the second encoded data to recover the input data.

In another class of preferred embodiments of the present invention, the medium to which the system exports the first and second encoded data is a storage medium. The export device includes a controller that stores the first encoded data and the second encoded data in the storage medium. Preferably, the system includes the storage medium. Also preferably, the controller is operative to retrieve a representation of the first encoded data and to retrieve a representation of the second encoded data from the storage medium. The controller applies a first decoding scheme to the representation of the first encoded data to recover the input data. If the application of the first decoding scheme fails, then the controller applies a second decoding scheme to the representation of the second encoded data to recover the input data.

In a third class of preferred embodiments of the present invention, the medium to which the system exports the first and second encoded data is a storage medium. The system includes, in addition to the export device, a memory device that includes the storage medium. The export device includes a processor that stores the first encoded data and the second encoded data in the storage medium. Preferably, the processor is operative to retrieve a representation of the first encoded data and to retrieve a representation of the second encoded data from the storage medium. The processor applies a first decoding scheme to the representation of the first encoded data to recover the input data. If the application of the first decoding scheme fails, then the processor applies a second decoding scheme to the representation of the second encoded data to recover the input data.

Another method of the present invention is a method of decoding a word that represents data. Usually, the word that is decoded is a codeword that represents the data, or else a corrupt version of the codeword. According to the basic method, a first decoding scheme is applied to at least a first portion of the word to recover the data. If the application of the first decoding scheme fails, then a second decoding scheme is applied to at least a second portion of the word to recover the data.

Preferably, at least one bit of the first portion of the word appears only in the first portion of the word and not in the second portion of the word, and at least one bit of the second portion of the word appears only in the second portion of the word and not in the first portion of the word.

The scope of the present invention also includes a receiver, for receiving such a word, that applies the basic method to recover the data; a controller, of a memory wherein such a word is stored, that applies the basic method to recover the data; a memory device that includes both the controller and the memory; and a system, for storing data, that includes a memory device wherein the data are represented as a word and a processor that applies the basic method to recover the data.

The scope of the present invention also includes computer-readable storage media having computer-readable code embedded thereon for implementing the methods of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
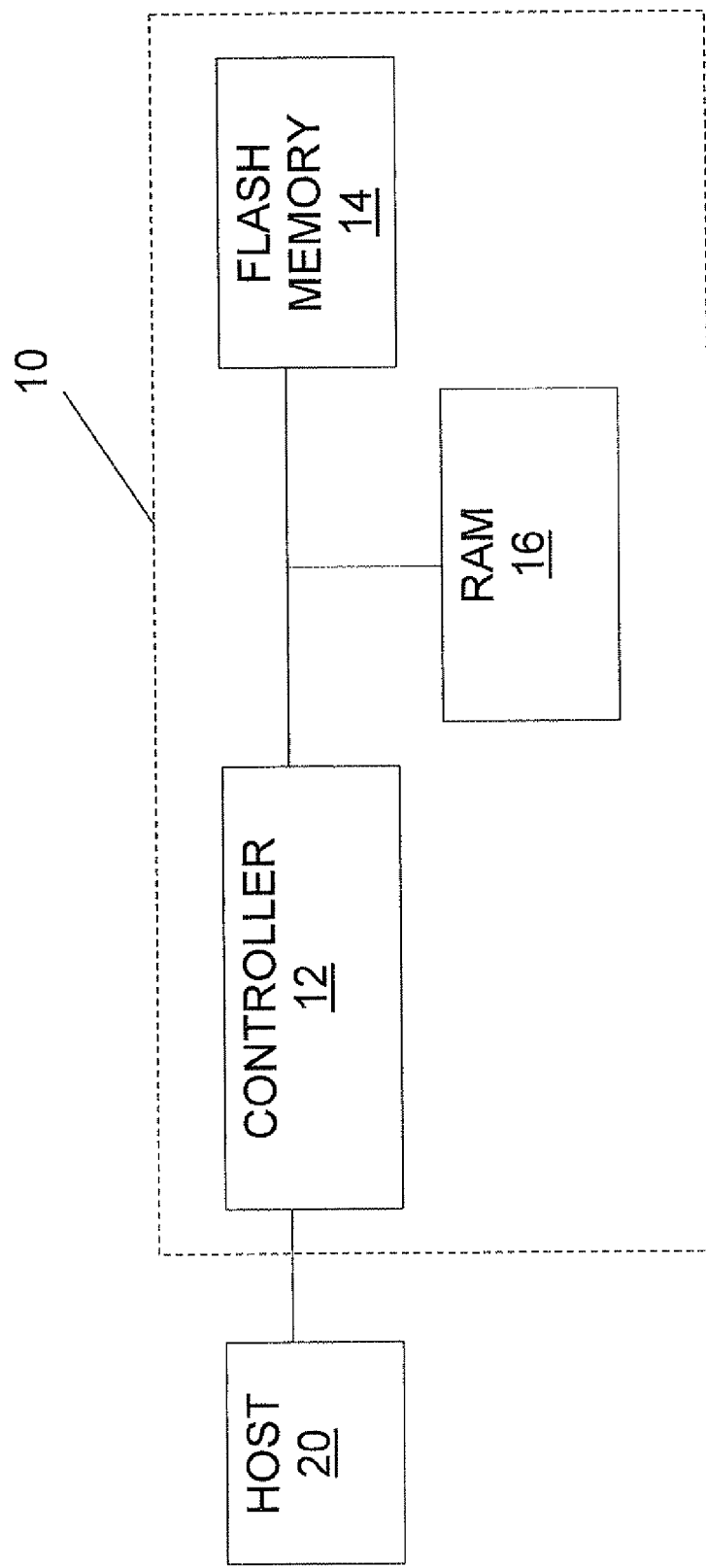
FIG. 1 is a high-level block diagram of a flash memory device of the present invention.

The principles and operation of error correction encoding and decoding according to the present invention may be better understood with reference to the drawings and the accompanying description.

The preferred embodiments of the present invention that are described herein are systematic ECC embodiments. It will be clear to those skilled in the art how to implement nonsystematic ECC embodiments of the present invention.

The solution to the problem described in the Field and Background section lies in using two different and independent ECC schemes for protecting the same data. (For the purpose of the present invention the term "ECC scheme" means a specific instantiation of an ECC algorithm, with all adjustable parameters set to specific fixed values).

Suppose we have D data bits that should be protected against any combination of not more than E bit errors. Also suppose we have two ECC schemes with the following characteristics a. A first ECC scheme capable of correcting E bit errors in D data bits, but having a relatively slow decoding time, not meeting the goal set for the average read speed.

b. A second ECC scheme capable of correcting $E_1$ bit errors in D data bits, where $E_1<E$. Additionally, this second ECC scheme is capable of detecting its own failure—in case the number of bit errors is higher than $E_1$ but not higher than E, the decoding algorithm provides a failure indication. ECC schemes that provide (for some error numbers) only error detection capability and not error correction capability are typically simpler than corresponding ECC schemes with full error correction capabilities. Therefore, this second ECC scheme is typically simpler than the first ECC scheme, and hence is also faster, meeting the read speed goal.

We now use the two ECC schemes for protecting D data bits in the following manner:

a. Before writing data to the memory, the first ECC algorithm is applied to the data bits in order to compute $P_1$ parity bits. A combination of the D data bits and the $P_1$ parity bits provides for correcting up to E errors in the data.

b. Before writing data to the memory, the second ECC algorithm is applied to the data bits in order to compute $P_2$ parity bits. A combination of the D data bits and the $P_2$ parity bits provides for correcting up to $E_1$ errors in the data, and for detecting up to E errors in the data.

c. The data bits, the $P_1$ parity bits, and the $P_2$ parity bits, are all recorded into the flash memory. Note that formally speaking we should not call the combination of the data bits, the $P_1$ parity bits and the $P_2$ parity bits a "codeword". The data bits plus the $P_1$ parity bits constitute a codeword for the first ECC scheme. The data bits plus the $P_2$ parity bits constitute a codeword for the second ECC scheme. But formally speaking there is no ECC scheme for which the combination of data bits plus the $P_1$ parity bits plus the $P_2$ parity bits is a codeword. Still, in order to simplify the language used herein, any combination of data bits with parity bits associated with that data and generated from that data is called herein a "codeword", regardless of whether there is a single known-in-the-art ECC algorithm that generates all of the parity bits from the data bits.

d. When the data are retrieved from the memory, the entire content is read—the data bits, the $P_1$ parity bits and the $P_2$ parity bits.

e. The decoder of the second ECC scheme is applied to the combination of the D data bits and the $P_2$ parity bits. If the number of errors happens to be equal to or less than $E_1$, the decoding ends successfully, the errors (if there were any) are corrected, the data are sent to the requesting software application and the reading operation ends.

r. If, on the other hand, the number of errors happens to be more than $E_1$ (but still less than E), the decoder of the second ECC scheme identifies this condition. In such case we apply the decoder of the first ECC scheme to the combination of the D data bits and the $P_1$ parity bits. As long as the number of errors is not higher than E (and by setting the reliability requirements to E errors we implicitly indicated that the probability of having more than E errors can be neglected), the decoding succeeds, all errors are corrected, the data are sent to the requesting software application and the reading operation ends.

Because the probability of a large number of errors in the data is typically much smaller than the probability of a small number of errors, the above procedure typically results in average decoding time that is close to the decoding time of the second ECC scheme, which is the faster of the two ECC schemes. This can easily be seen from the following simplified calculation example.

Suppose E=3 (that is—we must correct up to 3 errors in the data). Suppose $E_1=2$ (that is—the second ECC corrects only up to two errors). Suppose the probability of one error in the D data bits is $10^{-1}$. Then we can approximate the probability of two errors in the data as $10^{-2}$, and the probability of three errors in the data as $10^{-3}$. If the decoding time of the first ECC is 1000 microseconds and the decoding time of the second ECC is 10 microseconds, then the average decoding time of the above method is—$T=(1-10^{-3})\times10+10^{-3}\times1000=9.99+1=10.99$ microseconds. If the probability for an error in the data is lower (as is the case in many types of flash memories), then the average speed of the above method gets even much closer to the speed of the second ECC scheme.

Therefore we see that the method of the present invention achieves both of the following two goals simultaneously:

a. providing a fast decoding time; and b. providing the desired reliability level at the output of the memory system.

It should be noted that the benefits of the present invention do not come at no cost. The method requires the storing in the flash memory of parity bits of both the first ECC scheme and the second ECC scheme. The number of parity bits stored (which is the number of overhead bits spent for the error correction) is thus higher than the number of parity bits needed for the first ECC scheme, that provides the same level of error correction (i.e. E errors). We thus have traded average decoding speed for extra storage space used for parity bits, storage that is unavailable for storing data. However, there are many cases in which this trade-off is well justified, as the reading speed of the memory is much more important than the wasted storage space.

As there are already in the prior art ECC solutions that use two ECC decoders, we should emphasize the differences between those solutions and the present invention.

(1) One ECC algorithm well known in the prior art is the Turbo ECC algorithm.

In Turbo ECC the data bits are encoded twice by the same encoder, each time with the data bits in different order. When decoding, two similar decoders are operated in parallel on the same bits, such that the parity bits of both encodings contribute together to the errors correction, and information is exchanged between the two decoders during the decoding process. One must remember that Turbo codes are an example of what is called "soft decoders" in the ECC literature, where decoded bits are represented by nodes in a graph and the decoding is done iteratively in successive cycles, allowing the propagation of information between any two bits in the graph. This is unlike the present invention, in which only one decoder is operating on the data at any given time, and each decoder makes use only of its own parity bits and not of any other information.

(2) Even if there would have existed variants of the Turbo ECC algorithm that first attempt to decode using only one decoder, and only if that decoder fails activate the second decoder (and the present inventor is not aware of such variants), this is still different from the present invention in that the second decoder in these hypothetical Turbo ECC variants operates not on the data as read from the memory, but on modified data that already have been processed and modified by the first decoder. This is unlike the present invention, in which each decoder operates on the raw data bits as read from the memory, with no other input affecting its operation (except its own parity bits).

(3) Some prior art solutions (such as the solution taught by Lasser et al. in U.S. application Ser. No. 10/197,316 and the solution taught by Joshi et al. in U.S. Pat. No. 4,712,215) also utilize two ECC schemes in the following way—some (usually a small) portion of the data is protected by a first ECC scheme. All of the data, including the portion protected by the first ECC scheme and including the parity bits of the first ECC scheme, are protected by a second ECC scheme. Such solutions are meant to provide relatively fast and simple decoding for a small portion of the data, for example for control information describing some features of the main data portion. These solutions do not provide fast decoding of the full encoded data chunk, unlike the present invention.

(4) Even if there would have existed extensions of these solutions in which the first ECC encodes all of the data bits and not just a portion of the data bits, and the second ECC encodes all of the data bits including the parity bits of the first ECC (and the present inventor is not aware of such systems), this would still be different from the present invention, in which there is no information flow between the two decoders. This difference is an important advantage of the present invention, as it allows the two encoding operations to take place in parallel and thus complete relatively fast. This is unlike the above hypothetical systems, in which the second encoder must operate only after the first encoder has finished operating, as the output of the first encoder is an input to the second encoder.

The scope of the present invention includes the error correction methods described above. The scope of the present invention is not limited to flash memory systems, but also extends to any type of memory—magnetic, optical, or any other. The scope of the present invention also includes a memory system comprising a memory and a controller for the memory that employs the methods of the present invention. The scope of the present invention also includes a computing system that includes a memory system that employs the methods of the present invention. The scope of the present invention also includes a computing system that includes a memory and a host computer that employs the methods of the present invention, with no dedicated memory controller being used.

It should be noted that the methods of the present invention are not limited to memory systems. Error correction is also employed in communication systems, to recover from errors introduced into transmitted data bits while on their way to their destination. The scope of the appended claims should therefore also be construed to extend to errors correction methods and systems employed in correcting errors in transmitted data.

Referring now to the drawings, FIG. 1 is a high-level block diagram of a flash memory device 10 of the present invention, coupled to a host 20. FIG. 1 is adapted from FIG. 1 of Ban, U.S. Pat. No. 5,404,485, which patent is incorporated by reference for all purposes as if fully set forth herein. Flash memory device 10 includes a flash memory 14, a controller 12 and a random access memory (RAM) 16. Controller 12, that corresponds to "flash control 14" of U.S. Pat. No. 5,404,485, manages flash memory 14, with the help of RAM 16, as described in U.S. Pat. No. 5,404,485. When writing data to flash memory 14 or when reading data from flash memory 14, controller 12 applies the error correction method of the present invention as described above.

Figure 2:
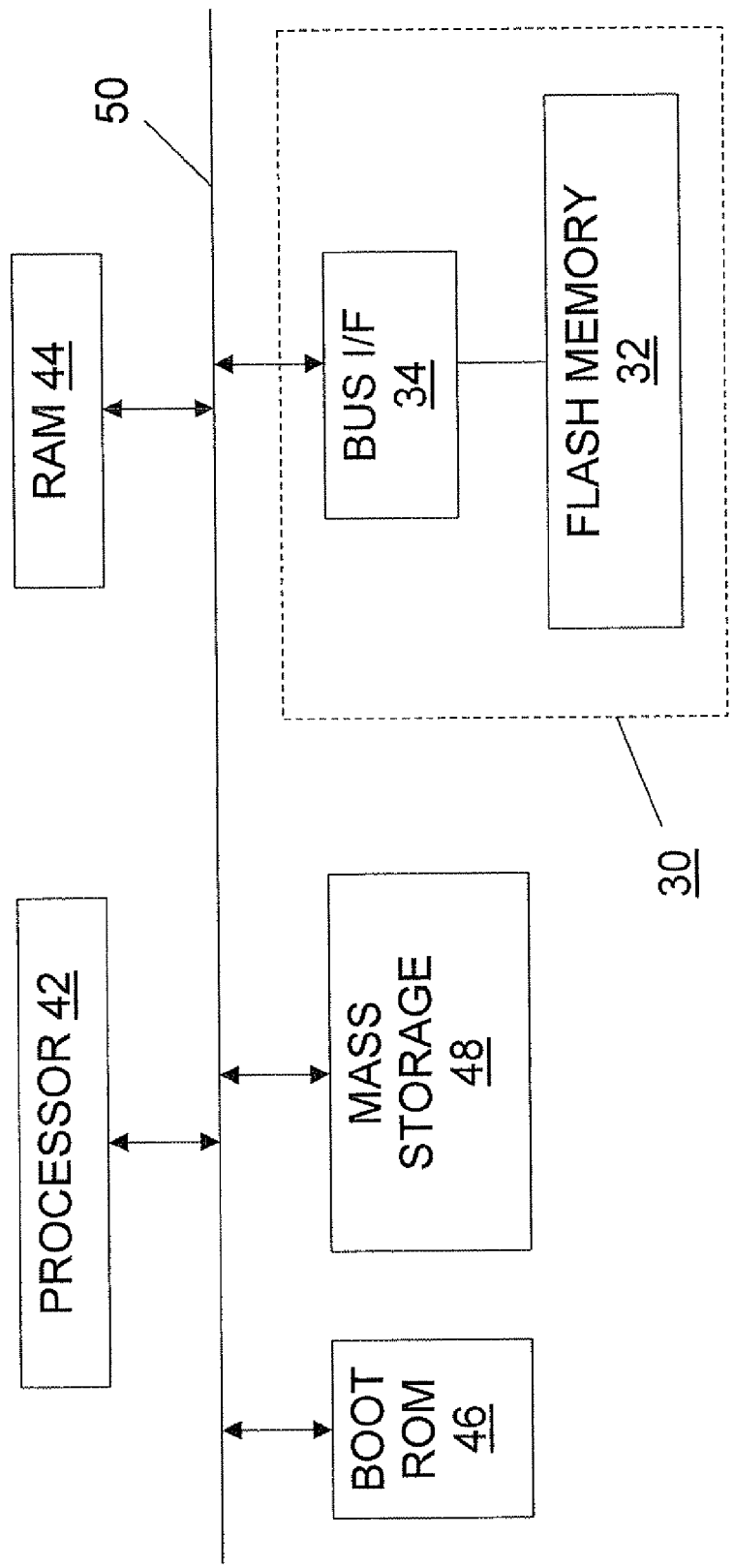
FIG. 2 is a high-level partial block diagram of a data storage system of the present invention.

FIG. 2 is a high-level partial block diagram of a data storage system 40 of the present invention. Data storage system 40 includes a processor 42 and four memory devices: a RAM 44, a boot ROM 46, a mass storage device (hard disk) 48 and a flash memory device 30, all communicating via a common bus 50. Like flash memory device 10, flash memory device 30 includes a flash memory 32. Unlike flash memory device 10, flash memory device 30 lacks its own controller and RAM. Instead, processor 42 emulates controller 12 by executing a software driver that implements the methodology of U.S. Pat. No. 5,404,485 in the manner e.g. of the TrueFFS™ driver of M-Systems Flash Disk Pioneers Ltd. of Kfar Saba, Israel. When writing data to flash memory device 30 or when reading data from flash memory device 30, processor 42 applies the error correction method of the present invention as described above. Flash memory device 30 also includes a bus interface 34 to enable processor 42 to communicate with flash memory 32.

The code of the software driver that processor 42 executes to manage flash memory 32 is stored in mass storage device 48 and is transferred to RAM 44 for execution. Mass storage device 48 thus is an example of a computer-readable code storage medium in which is embedded computer-readable code for managing flash memory 32 according to the principles of the present invention.

Figure 3:
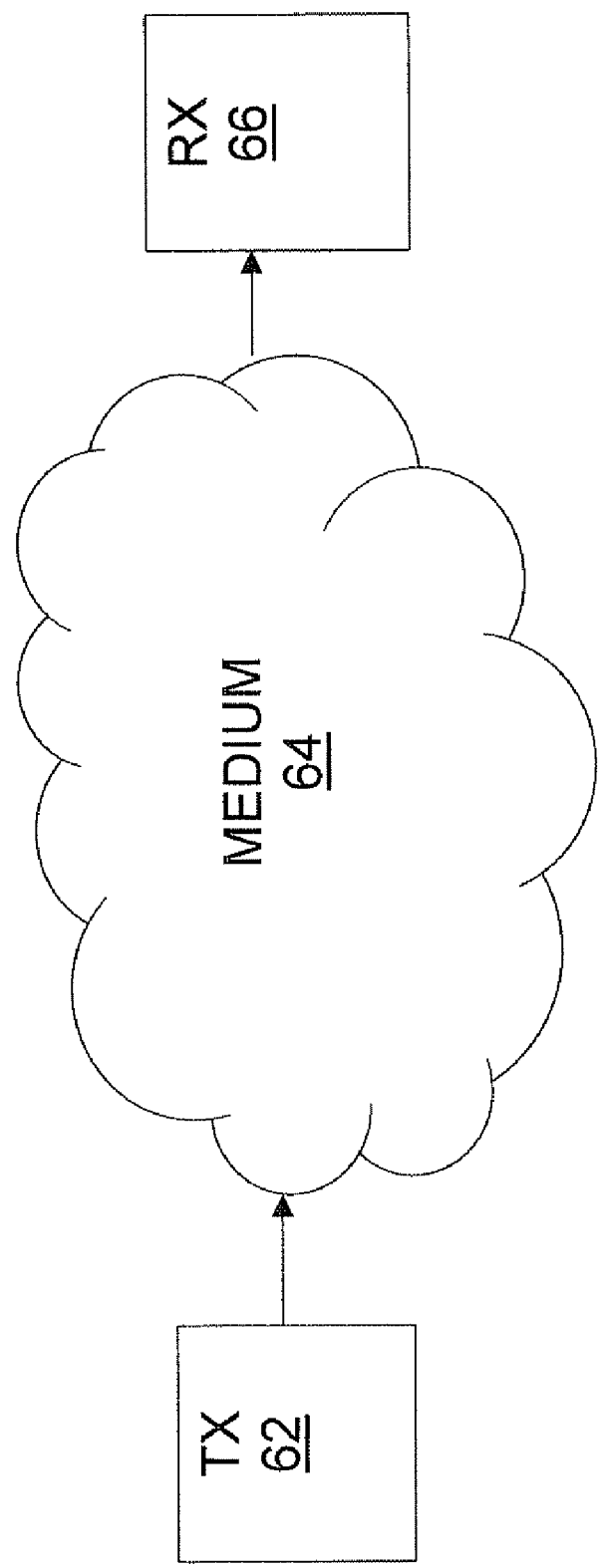
FIG. 3 is a schematic high-level block diagram of a data communication system of the present invention.

FIG. 3 is a schematic high-level block diagram of a data communication system 60 of the present invention. System 60 includes a transmitter 62, a transmission medium 64 and a receiver 66. Transmitter 62 transmits data to receiver 66 via medium 64. Before transmitting the data, transmitter 62 applies the error correction encoding of the present invention to the data. Upon receiving the transmitted data, receiver 66 applies the error correction decoding of the present invention to the data.

Transmission medium 64 may be any suitable medium for transmitting data using any suitable carrier of the data. Common examples of such media include free space and coaxial cables for radio frequency transmissions, and optical fibers for optical frequency transmissions. Transmitter 62 and receiver 66 are adapted to the nature of transmission medium 64. Data communication systems similar to system 60 that use prior art methods for error correction encoding and decoding are well known, and it is straightforward for one ordinarily skilled in the art to modify such a prior art system to use the error correction methodology of the present invention.

While the invention has been described with respect to a limited number of embodiments, it will be appreciated that many variations, modifications and other applications of the invention may be made.

What is claimed is:

1. A method, comprising:
   encoding only input data according to a first encoding scheme to generate first encoded data;
   encoding only the input data according to a second encoding scheme to generate second encoded data, wherein the first encoding scheme differs from the second encoding scheme;
   exporting the first encoded data and the second encoded data to a corrupting medium as a single codeword; and
   importing a representation of the codeword from the corrupting medium, wherein the representation of the codeword includes:
   a representation of the first encoded data; and
   a representation of the second encoded data.

2. The method of claim 1, wherein the encoding according to the first encoding scheme and the encoding according to the second encoding scheme are executed substantially simultaneously.

3. The method of claim 1, wherein the corrupting medium is a transmission medium and the exporting includes transmitting the first encoded data and the second encoded data via the transmission medium.

4. The method of claim 1, wherein at least one of the first encoding scheme and the second encoding scheme is a systematic encoding scheme.

5. The method of claim 1, wherein at least one of the first encoding scheme and the second encoding scheme is a non-systematic encoding scheme.

6. The method of claim 1, further comprising:
applying a first decoding scheme to the representation of the first encoded data to recover the input data; and
when the applying of the first decoding scheme fails to recover the input data, applying a second decoding scheme to the representation of the second encoded data to recover the input data.

7. The method of claim 6, wherein the first decoding scheme corresponds to the first encoding scheme and wherein the second decoding scheme corresponds to the second encoding scheme.

8. The method of claim 6, wherein the first decoding scheme is adapted to correct up to a first number of errors in a particular number of data bits, wherein the second decoding scheme is adapted to correct up to a second number of errors in the particular number of data bits, and wherein the second number of errors is greater than the first number of errors.

9. The method of claim 1, wherein encoding the input data according to the first encoding scheme generates a first set of parity bits, wherein encoding the input data according to the second encoding scheme generates a second set of parity bits, and wherein the input data, the first set of parity bits, and the second set of parity bits are stored within the single codeword.

10. The method of claim 1, wherein the corrupting medium includes a flash memory within a flash memory device, and wherein the first encoding scheme and the second encoding scheme are implemented by a controller within the flash memory device.

11. The method of claim 1, further comprising:
applying a first decoding scheme to a first portion of the representation of the codeword to recover the input data; and
when first decoding scheme fails to recover the input data, applying a second decoding scheme to a second portion of the representation of the codeword to recover the input data.

12. The method of claim 11, wherein the first decoding scheme fails to recover the input data when an error count associated with the codeword exceeds a predetermined threshold.

13. A system comprising:
a flash memory; and
a controller coupled to the flash memory and configured to:
encode only input data according to a first encoding scheme to generate first encoded data;
encode only the input data according to a second encoding scheme to generate second encoded data, wherein the first encoding scheme differs from the second encoding scheme;
export the first encoded data and the second encoded data to the flash memory as a single codeword; and
import a representation of the codeword from the flash memory, wherein the representation of the codeword includes:
a representation of the first encoded data; and
a representation of the second encoded data.

14. The system of claim 13, wherein the controller is further operative to:
apply a first decoding scheme to the representation of the first encoded data to recover the input data; and
when the application of the first decoding scheme fails to recover the input data, apply a second decoding scheme to the representation of the second encoded data to recover the input data.

15. A computer-readable storage medium having computer-readable code embodied on the computer-readable storage medium including processor-executable instructions that, when executed by a processor, cause the processor to:
encode only input data according to a first encoding scheme to generate first encoded data;
encode only the input data according to a second encoding scheme that differs from the first encoding scheme, to generate second encoded data;
store the first encoded data and the second encoded data as a single codeword at a storage medium; and
import a representation of the codeword from the storage medium, wherein the representation of the codeword includes:
a representation of the first encoded data; and
a representation of the second encoded data.

16. The computer-readable storage medium of claim 15, further including instructions to:
apply a first decoding scheme to a first portion of the representation of the codeword to recover the input data; and
when first decoding scheme fails to recover the input data, apply a second decoding scheme to a second portion of the representation of the codeword to recover the input data.

17. A method of decoding a word, the method comprising:
receiving the word via a medium, wherein the word includes:
a first representation of data, wherein the data has been encoded according to a first encoding scheme; and
a second representation of the data, wherein the data has been encoded according to a second encoding scheme that is distinct from the first encoding scheme;
applying a first decoding scheme to the first representation of the data to recover the data; and
when the first decoding scheme fails to recover the data, applying a second decoding scheme to the second representation of the data to recover the data.

18. The method of claim 17, wherein the first decoding scheme is associated with a first processing time and the second decoding scheme is associated with a second processing time, and wherein the second processing time exceeds the first processing time.

19. A receiver, the receiver operative to:
receive a representation of a codeword including a representation of first encoded data and a representation of second encoded data, wherein the first encoded data encodes only input data according to a first encoding scheme and the second encoded data encodes only the input data according to a second encoding scheme, wherein the first encoding scheme differs from the second encoding scheme;
apply a first decoding scheme to the representation of the first encoded data to recover the input data; and
when the application of the first decoding scheme to the representation of the first encoded data fails to recover the input data, apply a second decoding scheme to the representation of the second encoded data to recover the input data.

20. A controller of a memory, the memory storing data as a word, the controller being operative to:
- apply a first decoding scheme to a first portion of the word to recover the data; and
- when the application of the first decoding scheme to the first portion of the word fails to recover the data, apply a second decoding scheme to a second portion of the word to recover the data, wherein the first portion of the word differs from the second portion of the word.

21. The controller of claim 20, wherein:
- the first portion of the word includes a first representation of the data, wherein the data has been encoded according to a first encoding scheme that corresponds to the first decoding scheme; and
- the second portion of the word includes a second representation of the data, wherein the data has been encoded according to a second encoding scheme that corresponds to the second decoding scheme and that is distinct from the first encoding scheme.

22. A memory device comprising:
- a memory to store data as a word, wherein the word includes:
  - first encoded data that encodes only the data according to a first encoding scheme; and
  - second encoded data that encodes only the data according to a second encoding scheme; and
- a controller operative to:
  - import a representation of the word from the memory, wherein the representation of the word includes:
    - a representation of the first encoded data; and
    - a representation of the second encoded data.

23. The memory device of claim 22, wherein the controller is further operative to:
- apply a first decoding scheme to the representation of the first encoded data, wherein the first decoding scheme is associated with the first encoding scheme; and
- when first decoding scheme fails to recover the data, apply a second decoding scheme to the representation of the second encoded data to recover the input data, wherein the second decoding scheme is associated with the second encoding scheme.

24. A system to store data, the system comprising:
- a memory device to store a word that includes:
  - first encoded data, wherein the first encoded data encodes only data according to a first encoding scheme., and
  - second encoded data that encodes only the data according to a second encoding scheme, wherein the second encoding scheme differs from the first encoding scheme; and
- a processor operative to:
  - import a representation of the word from the memory, wherein the representation of the word includes:
    - a representation of the first encoded data; and
    - a representation of the second encoded data.

25. The system of claim 24, wherein the processor is further operative to:
- apply a first decoding scheme to the word, wherein the first decoding scheme is associated with the first encoding scheme; and
- when first decoding scheme fails to recover the data, apply a second decoding scheme to the word to recover the data, wherein the second decoding scheme is associated with the second encoding scheme.

26. The method of claim 24, wherein the first decoding scheme is associated with a first processing time and the second decoding scheme is associated with a second processing time, and wherein the second processing time exceeds the first processing time.

27. A method comprising:
- encoding only input data according to a first encoding scheme to generate first encoded data;
- encoding only the input data according to a second encoding scheme to generate second encoded data, wherein the second encoding scheme differs from the first encoding scheme;
- storing the first encoded data and the second encoded data as a single word at a storage medium; and
- retrieving a representation of the single word from the storage medium, wherein the representation of the single word includes:
  - a representation of the first encoded data; and
  - a representation of the second encoded data.

28. The method of claim 27, wherein the encoding according to the first encoding scheme and the encoding according to the second encoding scheme are executed substantially simultaneously.

29. The method of claim 27, further including:
- applying a first decoding scheme to the representation of the first encoded data to recover the input data; and
- when first decoding scheme fails to recover the input data, applying a second decoding scheme to the representation of the second encoded data to recover the input data.

30. The method of claim 29, wherein the first decoding scheme fails to produce the input data when an error count associated with the representation of the single word exceeds a predefined threshold, and the second decoding scheme produces the input data when the error count is less than or equal to the predefined threshold.

31. A computer-readable storage medium having computer-readable code embodied on the computer-readable storage medium, the computer-readable code comprising processor-executable instructions that, when executed by a processor, cause the processor to:
- encode only data as first encoded data, wherein the data is encoded according to a first encoding scheme;
- encode only the data as second encoded data, wherein the data is encoded according to a second encoding scheme;
- store the first encoded data and the second encoded data as a single codeword at a memory; and
- import a representation of the word from the memory, wherein the representation of the word includes:
  - a representation of the first encoded data; and
  - a representation of the second encoded data.

32. The computer-readable storage medium of claim 31, further including instructions to:
- apply a first decoding scheme to the representation of the first encoded data to recover the data; and
- when first decoding scheme fails to recover the data, apply a second decoding scheme to the representation of the second encoded data to recover the data.

33. The computer-readable storage medium of claim 32, wherein the first decoding scheme fails to recover the data when an error count associated with the representation of the word exceeds a predefined threshold.

* * * * *

UNITED STATES PATENT AND TRADEMARK OFFICE
CERTIFICATE OF CORRECTION

| | | |
|---|---|---|
| PATENT NO. | : 7,823,043 B2 | |
| APPLICATION NO. | : 11/505798 | |
| DATED | : October 26, 2010 | |
| INVENTOR(S) | : Menahem Lasser | |

It is certified that error appears in the above-identified patent and that said Letters Patent is hereby corrected as shown below:

In the Claims section, Column 13, Claim 24, Line 46, "scheme., and" should read --scheme; and--.

Signed and Sealed this
Fourteenth Day of May, 2013

Teresa Stanek Rea
*Acting Director of the United States Patent and Trademark Office*